US010074647B2

(12) United States Patent
Lai et al.

(10) Patent No.: US 10,074,647 B2
(45) Date of Patent: Sep. 11, 2018

(54) ESD PROTECTION CIRCUIT FOR PROVIDING CROSS-DOMAIN ESD PROTECTION

(71) Applicant: NXP B.V., Eindhoven (NL)

(72) Inventors: Da-Wei Lai, Nijmegen (NL); Dolphin Abessolo Bidzo, Nijmegen (NL)

(73) Assignee: NXP B.V., Eindhoven (NL)

( * ) Notice: Subject to any disclaimer, the term of this patent is extended or adjusted under 35 U.S.C. 154(b) by 310 days.

(21) Appl. No.: 15/013,070

(22) Filed: Feb. 2, 2016

(65) Prior Publication Data

US 2016/0225758 A1 Aug. 4, 2016

(30) Foreign Application Priority Data

Feb. 4, 2015 (EP) .................................... 15153763

(51) Int. Cl.
*H01L 27/02* (2006.01)
*H02H 9/04* (2006.01)
*H01L 27/092* (2006.01)

(52) U.S. Cl.
CPC ...... *H01L 27/0292* (2013.01); *H01L 27/0251* (2013.01); *H01L 27/0255* (2013.01);
(Continued)

(58) Field of Classification Search
CPC ......... H01L 2924/0002; H01L 2924/00; H01L 27/0251; H01L 27/0292; H01L 23/60;
(Continued)

(56) References Cited

U.S. PATENT DOCUMENTS 6,653,670 B2 * 11/2003 Ker ..................... H01L 27/0251 257/199
7,280,328 B2 * 10/2007 Arai .................... H01L 27/0285 257/362

(Continued)

OTHER PUBLICATIONS

Chen, Shih-Hung et al; "Active ESD Protection Design for Interface Circuits Between Separated Power Domains Against Cross-Power-Domain ESD Stresses"; IEEE Transactions on Device and Materials Reliability, vol. 8, No. 3; pp. 549-560 (Sep. 2008).

(Continued)

*Primary Examiner* — Thienvu Tran
*Assistant Examiner* — Nicolas Bellido

(57) ABSTRACT

A semiconductor device and method. The device includes a first domain and a second domain each having a power rail and a ground rail. The device further includes a signal line connected between the first domain and the second domain. The device also includes an electrostatic discharge protection circuit for providing cross-domain ESD protection. The protection circuit includes a blocking transistor connected between the first domain power rail and the signal line. The protection circuit also includes a power rail clamp connected between the first domain power rail and the first domain ground rail. The power rail clamp is operable to apply a control signal to a gate of the blocking transistor to switch it on during normal operation and to switch it off during an ESD event. The power rail clamp is operable during the ESD event to conduct an ESD current.

15 Claims, 6 Drawing Sheets

(52) U.S. Cl.
CPC ........ *H01L 27/0266* (2013.01); *H01L 27/092* (2013.01); *H02H 9/046* (2013.01)

(58) Field of Classification Search
CPC ............. H01L 27/0266; H01L 27/0285; H01L 27/0255; H01L 27/092; H01L 27/0248; H01L 27/0262; H01L 27/0296; H02H 9/046; H02H 9/04; H02H 9/045; H03K 19/00315; Y10T 29/49117; Y10T 29/4915
USPC ........ 361/21, 56; 257/355, 369; 29/825, 846
See application file for complete search history.

(56) References Cited

U.S. PATENT DOCUMENTS 7,817,386 B2 * 10/2010 Ker ..................... H01L 27/0266 361/56
8,767,360 B2 * 7/2014 Lin ........................ H02H 9/046 361/56
8,848,326 B2 * 9/2014 Lai ................... H03K 19/00315 361/56
2006/0114047 A1 * 6/2006 Irino ................... H01L 27/0266 327/328
2007/0085144 A1 * 4/2007 Chen ................... H01L 27/0251 257/362
2007/0182444 A1 * 8/2007 Tanaka ................ H01L 27/0251 326/21
2007/0223163 A1 * 9/2007 Hung .................. H01L 27/0251 361/93.1
2008/0062597 A1 3/2008 Chen et al.
2010/0102392 A1 * 4/2010 Arakawa ................ H01L 23/60 257/355
2010/0296213 A1 * 11/2010 Lee ..................... H01L 27/0251 361/56
2011/0255200 A1 10/2011 Tsai et al.
2013/0321961 A1 * 12/2013 Lin ........................ H02H 9/046 361/56
2014/0092507 A1 4/2014 Lefferts et al.

OTHER PUBLICATIONS

Chen, Shih-Hung, et al; "Local CDM ESD Protection Circuits for Cross-Power Domains in 3D IC Applications"; IEEE Transactions on Device and Materials Reliability, vol. 14, No. 2; pp. 781-783 (Jun. 2014).
Okushima, Mototsugu; "ESD Protection Design for Mixed-Power Domains in 90nm CMOS with New Efficient Power Clamp and GND Current Trigger (GCT) Technique"; EOS/ESD Symposium 06-205; 9 pages (2006).
Extended European Search Report for Appln. No. 15153763.6 (dated Feb. 4, 2015).

* cited by examiner

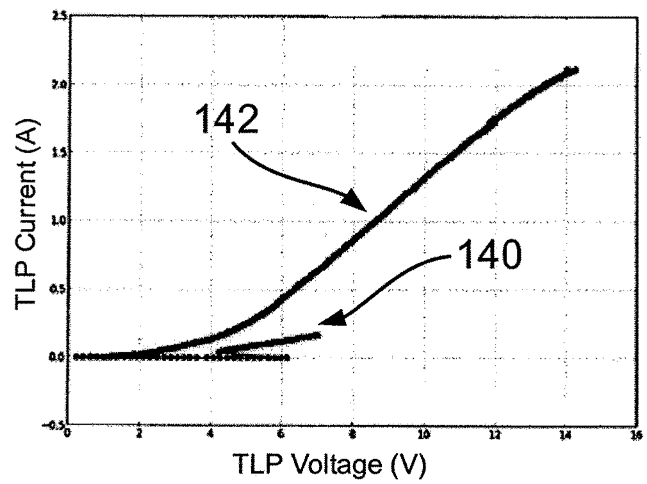
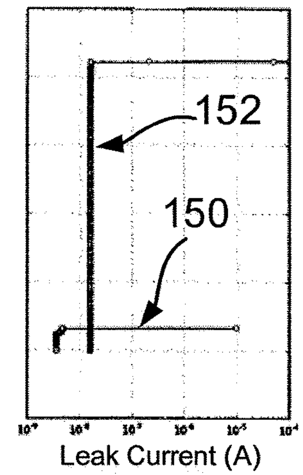
Fig. 6A
Fig. 6B
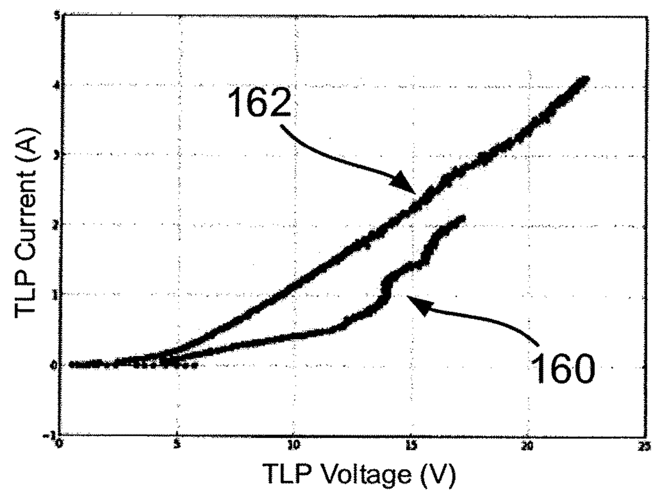
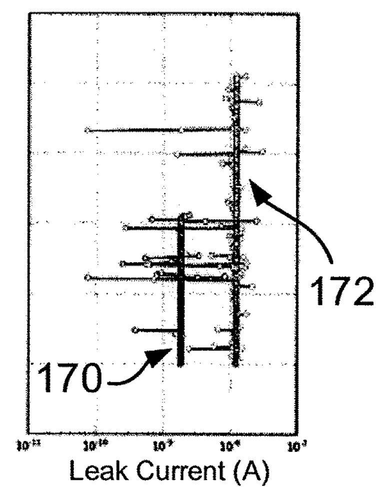
Fig. 7A
Fig. 7B

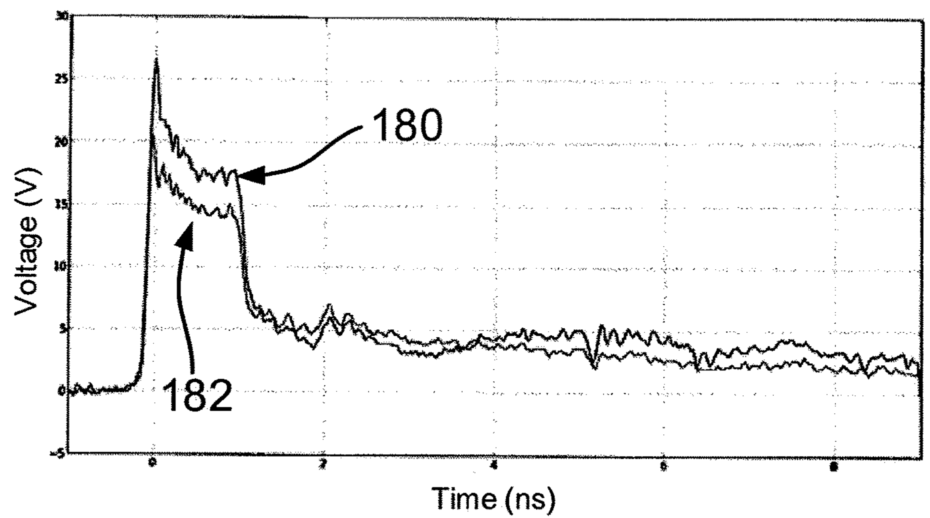
Fig. 8
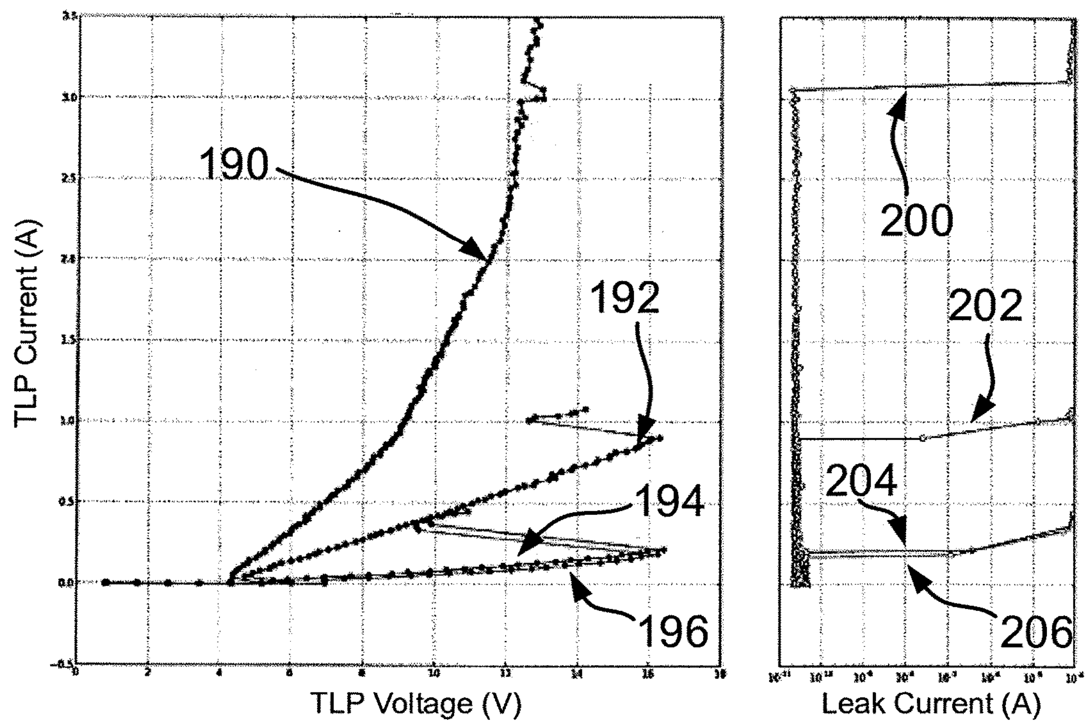
Fig. 9A
Fig. 9B

ESD PROTECTION CIRCUIT FOR PROVIDING CROSS-DOMAIN ESD PROTECTION

CROSS-REFERENCE TO RELATED APPLICATIONS

This application claims the priority under 35 U.S.C. § 119 of European patent application no. 15153763.6, filed Feb. 4, 2015 the contents of which are incorporated by reference herein.

FIELD OF THE INVENTION

This invention relates to a semiconductor device comprising an electrostatic discharge (ESD) protection circuit.

BACKGROUND OF THE INVENTION

Cross domain electrostatic discharge (ESD) protection is becoming difficult to achieve in advanced semiconductor technology nodes due to a number of challenges, most commonly associated with the ever smaller size of devices such as transistors provided in an integrated circuit.

FIG. 1 shows an example of a conventional semiconductor device 10. The device has a digital domain that includes a digital domain power rail 2 and a digital domain ground rail 4 (these are also labelled DVDD and DVSS in FIG. 1, respectively). The device 10 also includes an analogue domain that has an analogue domain power rail 6 and an analogue domain ground rail 8 (these are also labelled AVDD and AVSS in FIG. 1, respectively). The digital domain and the analogue domain may form part of a mixed signal device.

The digital domain and the analogue domain are connected via a signal line 3 for passing signals between each domain. The digital domain includes a CMOS inverter having a PMOS transistor Mp1 and an NMOS transistor Mn1 for driving signals on the signal line 3 as is known in the art. Similarly, the analogue domain has an inverter that also comprises a pair of PMOS and NMOS transistors (Mp2 and Mn2) connected to the signal line 3 for receiving signals transmitted by the digital domain. Each CMOS inverter is connected between the power rail and ground rail of its respective domain.

As is well known in the art of ESD circuit protection, various different modes of ESD zapping are possible. Accordingly, the device of FIG. 1 is provided with a number of features to protect against ESD events. For instance, to protect against ESD zapping from the analogue domain ground rail 8 to the digital domain power rail 2, a local Charged Device Model (CDM) clamp is provided between the signal line 3 and the analogue domain ground rail 8. The local CDM clamp comprises a transistor that is labelled Mesd in FIG. 1, and provides a discharge path from the analogue domain ground rail 8 through Mesd, the signal line 3 and the transistor Mp1 to the digital domain power rail 2 in the event of such a zapping. This discharge path bypasses the transistors Mp2 and Mn2 of the CMOS inverter of the analogue domain, thereby to avoid damage to the gate oxide of either transistor during the ESD event.

In addition, a power rail clamp 14 is provided between the digital domain power rail 2 and the digital domain ground rail 4 as is known in the art. Similarly, a power rail clamp 16 is provided in the analogue domain between the analogue domain power rail 6 and the analogue domain ground rail 8. These power rail clamps 14 and 16 provide a discharge path for ESD currents flowing between the power rails and the ground rails of each respective domain. Accordingly, for instance, for ESD zapping between the digital domain power rail 2 and the digital domain ground rail 4, the power rail clamp 14 can provide a discharge path that bypasses the CMOS inverter including the transistors Mp1 and Mn1. Similarly, the power rail clamp 16 of the analogue domain can provide a discharge path for ESD zapping between the analogue domain power rail 6 and the analogue domain ground rail 8 that bypasses the analogue domain CMOS inverter and its transistors Mp2 and Mn2.

To provide a discharge path for ESD zapping to flow between the two ground rails, a pair of back-to-back diodes 12 are used to connect the two ground rails together, as is known in the art.

For cross domain zapping, a number of problems exist. For instance, for ESD zapping from the digital domain power rail 2 to the analogue domain ground rail 8, the ideal current path is through the ESD power rail clamp 14 and the pair of back-to-back diodes 12 as indicated by the dotted line 22 in FIG. 1. This discharge path avoids any of the delicate circuitry of the semiconductor device. In practice however, since the state of the gate nodes of the transistors Mp1 and Mn1 of the CMOS inverter of the digital domain is not generally known (for instance they may be floating), in some situations (the worst case being where the gate node is at zero volts at the time of the ESD event) at least some of the ESD current may follow an alternative discharge path. This alternative discharge path is indicated by the dotted line labelled 24 in FIG. 1. The alternative discharge path 24 flows through the transistor Mp1 of the CMOS inverter of the digital domain and along the signal line 3. In such situations, the transistor Mesd may form a path for the ESD current to reach the analogue domain ground rail 8. Absent this current path for the current to reach the analogue domain ground rail 8, a high voltage is applied by the ESD discharge to the gate oxide of the transistor Mn2 of the CMOS inverter of the analogue domain, which may potentially damage the gate oxide, causing failure of the semiconductor device.

It is anticipated that in many ESD events the discharge of the ESD current through Mesd would protect the gate oxide of Mn2. However, this is reliant upon Vav of Mesd being lower than the breakdown voltage of the gate oxide of Mn2 under positive ESD zapping from the digital domain power rail 2 to the analogue domain ground rail 8. However, for more advanced technology nodes in which the gate oxide of the transistor Mn2 is relatively thin (for example, less than 40 Angstroms), it is typically the case that the above-mentioned condition is not met, so that Mesd cannot turn on fast enough to protect the gate oxide of Mn2. Accordingly, in advanced technology nodes, it may be that the ESD protection provided for the semiconductor device 10, at least in the case of ESD zapping between the digital domain power rail 2 and the analogue domain ground rail 8 is insufficient to protect Mn2.

A known response to this problem is shown in FIG. 2. The semiconductor device 10 in FIG. 2 is similar to that described above in relation to FIG. 1. Only the differences between the two circuits will be described here.

In the example of FIG. 2, the signal line 3 is provided with an interface resistor 32 and also a discharge path is provided through a diode 34 from the signal line 3 to the analogue domain power rail 6.

Firstly, the interface resistor 32 causes a voltage drop on the signal line 3 that assists in ensuring that Vav of Mesd remains lower than the breakdown voltage of the oxide of Mn2 under ESD zapping from the digital domain power rail 2 to the analogue domain ground rail 8. Secondly, the diode 34 provides an alternative discharge path labelled by the dotted line 26 that avoids the CMOS inverter of the analogue domain. Thus, ESD current discharging through the signal line 3, can pass through the diode 34 to reach the analogue domain power rail 6, from where it may be discharged to the analogue domain ground rail 8 through the analogue domain power rail clamp 16.

However, the steps taken in FIG. 2 as described above themselves suffer from a number of deficiencies. Firstly, the provision of an interface resistor 32 on the signal line 3 is generally undesirable as this can adversely affect high frequency performance of the device 10. Secondly, the path through the diode 34 can lead to high leakage from the digital domain power rail 2 to the analogue domain power rail 6 if there is no clear usage of a power-up sequence.

U.S. Pat. No. 7,817,386 describes an ESD protection circuit for an integrated circuit with separated power domains. US2013/0279052 describes an ESD protection device with a tuneable holding voltage for a high voltage programming pad. Further examples of ESD protection are described in an article by Mototsugu Okushima entitled “ESD protection design for mixed-power domains in 90 nm CMOS with new efficient power clamp and GND current trigger (GCT) technique”, EOS/ESD Symposium 06-205, and in an article by Chen et al., entitled “Local CDM ESD Protection Circuits for Cross-Power Domains in 3D IC Applications”, IEEE transactions on device and materials reliability, Vol. 14, No. 2, June 2014.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device. The device includes a first domain including a first domain power rail and a first domain ground rail. The device also includes a second domain including a second domain power rail and a second domain ground rail. The device further includes a signal line connected between the first domain and the second domain. the device also includes an electrostatic discharge (ESD) protection circuit for providing cross-domain ESD protection. The ESD protection circuit includes a blocking transistor connected between the first domain power rail and the signal line. The ESD protection circuit also includes a power rail clamp connected between the first domain power rail and the first domain ground rail. The power rail clamp is operable during normal operation of the device to apply a control signal to a gate of the blocking transistor to allow current to flow from the first domain power rail through the signal line. The power rail clamp is operable during an ESD event to conduct an ESD current between the first domain power rail and the first domain ground rail. The power rail clamp is also operable during an ESD event to apply a control signal to the gate of the blocking transistor to block an ESD current from flowing from the first domain power rail through the signal line.

According to another aspect of the invention, there is provided a method for providing cross-domain electrostatic discharge (ESD) protection in a semiconductor device having a first domain including a first domain power rail and a first domain ground rail, a second domain including a second domain power rail and a second domain ground rail, and a signal line connected between the first domain and the second domain. The method includes, during normal operation of the device, a power rail clamp connected between the first domain power rail and the first domain ground rail applying a control signal to a gate of a blocking transistor connected between the first domain power rail and the signal line to allow current to flow from the first domain power rail through the signal line. The method also includes, during an ESD event, the power rail clamp conducting an ESD current between the first domain power rail and the first domain ground rail. The method further includes, during an ESD event, the power rail clamp applying a control signal to the gate of the blocking transistor to block an ESD current from flowing from the first domain power rail through the signal line.

The provision of the blocking transistor can prevent an ESD current from the first domain power rail from damaging circuitry in the semiconductor device by preventing the ESD current from reaching the signal line. The power rail clamp of the first domain can apply control signals to the gate of the blocking transistor to allow current from the first domain power rail to reach the signal line during normal operation or to be blocked in an ESD event. Accordingly, the blocking transistor need not interfere with the normal operation of the device.

The power rail clamp may be an RC-triggered power rail clamp. RC-triggered power rails clamps may use an internal control signal that is produced by a trigger stage for activating a discharge stage of the clamp during an ESD event. This internal control signal may, in some embodiments, also be used to control the blocking transistor. Accordingly, in one embodiment, the RC-triggered power rail clamp includes a discharge stage for conducting the ESD current between the first domain power rail and the first domain ground rail, and a trigger stage comprising an RC circuit for detecting the ESD event and activating the discharge stage to conduct the ESD current. In this embodiment, the blocking transistor may be operable to block an ESD current from flowing from the first domain power rail through the signal line while the discharge stage of the RC-triggered power rail clamp is active. For instance, the control signal applied to the gate of the blocking transistor may correspond to a control signal applied to the discharge stage by the trigger stage to activate the discharge stage.

The device may be a mixed signal device. The first domain may be a digital domain of the semiconductor device and the second domain may be an analogue domain of the device. However, it is envisaged that other configurations are possible (e.g. the first domain may be an analogue domain and the second domain may be a digital domain).

In one embodiment, the control signal applied to the gate of the blocking transistor may be a control voltage. The control voltage may, for instance, be produced by an RC timing circuit of a trigger stage of the power rail clamp of the first domain.

The first domain ground rail may be connected to the second domain ground rail whereby. This can allow an ESD current to flow from the first domain ground rail to the second domain ground rail, for instance where the ESD zapping is between the first domain power rail and the second domain ground rail. In one embodiment, the first domain ground rail and the second domain ground rail are connected together via a plurality of diodes arranged in a back-to-back configuration.

The first domain may further include an output stage comprising a CMOS inverter connected to the signal line, and the second domain may further include an input stage comprising a CMOS inverter connected to the signal line. The ESD protection circuit may operate to protect delicate components of these inverters during an ESD event. For instance, the blocking of an ESD current from flowing from the first domain power rail through the signal line can protect a gate dielectric of an NMOS transistor of the CMOS inverter of the input stage against ESD damage.

In one embodiment, the device can further include a local charged device model clamp comprising a transistor connecting the second domain ground rail to the signal line. This can provide a path for an ESD current to flow from the second domain ground rail to the first domain power rail (i.e. where the ESD zapping is from the second domain ground rail to the first domain power rail).

It has been found that the ESD robustness of the device can be enhanced if a resistance of a part of the second domain ground rail between a source of the transistor of the local charged device model clamp and a source of the NMOS transistor of the CMOS inverter of the input stage is no greater than 10Ω.

As described herein, the signal line of the device need not include an interface resistor, of a diode connecting the signal line to the second domain power rail, since the blocking transistor can prevent current flowing from the first domain power rail through the signal line during an ESD event. The corresponding low resistance of the signal line can, enhance the normal operation of the device at high frequencies (e.g. at radio frequencies), and the absence of a diode connecting the signal line and the second domain power rail can minimise leakage from the first domain power rail to the second domain power rail.

According to a further aspect of the invention, there is provided a Radio Frequency (RF) circuit comprising a semiconductor device of the kind described above.

For the purposes of this application, radio frequency (RF) signals may be considered to be signals in the frequency range 4 GHz≤f≤40 GHz. For instance, the RF signals may be in one of the following IEEE bands: C band=4-8 GHz, $K_u$ band=12-18 GHz, $K_a$ band=26.5-40 GHz.

For the purposes of this application, the terms "power rail" and "ground rail" refer to reference voltages that are used to operate the device. Typically, the power rail is held at a higher potential than the ground rail. In such configurations, it is common to use the terms power rail and ground rail, although it is noted that the term "ground rail" does not necessarily imply that the ground rail is held at 0 V (i.e. the ground rail may be biased at a non-zero voltage which is nevertheless lower than that of the power rail).

BRIEF DESCRIPTION OF THE DRAWINGS

Embodiments of the present invention will be described hereinafter, by way of example only, with reference to the accompanying drawings in which like reference signs relate to like elements and in which:

FIGS. 6A and 6B each show transmission line pulse (TLP) data relating to a semiconductor device including an electrostatic discharge protection circuit in accordance with an embodiment of the invention;

FIGS. 7A and 7B each show very fast transmission line pulse (vf-TLP) data relating to a semiconductor device including an electrostatic discharge protection circuit in accordance with an embodiment of the invention;

FIG. 8 shows the voltage wave form under vf-TLP conditions corresponding to the data of FIGS. 7A and 7B, and FIGS. 9A and 9B each show very fast transmission line pulse (vf-TLP) data relating to a semiconductor device including an electrostatic discharge protection circuit in accordance with a further embodiment of the invention.

DETAILED DESCRIPTION

Embodiments of the present invention are described in the following with reference to the accompanying drawings.

Embodiments of this invention can provide a semiconductor device including a first domain and a second domain that are provided with ESD protection by a protection circuit that includes a blocking transistor. The blocking transistor may be connected between the first domain power rail and a signal line of the semiconductor device for preventing current passing from the first domain power rail to the signal line in an ESD event. On the other hand, the blocking transistor may remain switched on during normal operation of the device. A power rail clamp may be connected between the first domain power rail and the first domain ground rail to allow an ESD current to discharge from the first domain power rail to the first domain ground rail during an ESD event. In accordance with an embodiment of this invention, the power rail clamp is also operable to control the blocking transistor using a control signal to either block or permit current passing from the first domain power rail to the signal line as noted above. Accordingly, embodiments of this invention can prevent ESD discharge through the signal line in an ESD event, thereby protecting delicate internal circuitry of the device (for instance, the gate oxide of a transistor of a CMOS inverter of the second domain connected to the signal line to receive signals sent by the first domain). Accordingly, a problem relating to the failure of prior ESD protection circuits to protect the internal circuitry of a device during certain ESD discharge conditions may be solved in a manner that does not necessarily require the provision of an interface resistor or a diode connected between the signal line and the second domain power rail.

In the following, examples of the invention are described in which the first domain is a digital domain and the second domain is an analogue domain. However, it is envisaged that other configurations are possible (e.g. the first domain may be an analogue domain and the second domain may be a digital domain).

Figure 1:
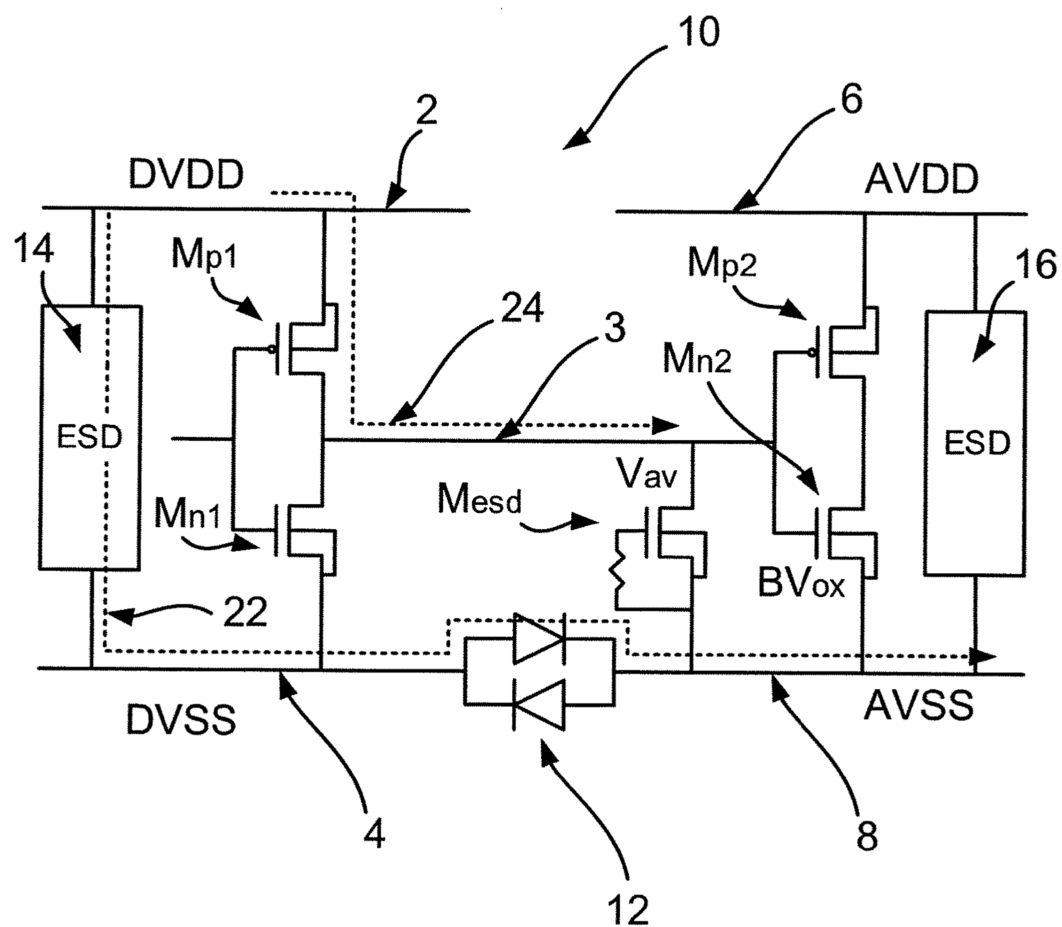
FIG. 1 shows a semiconductor device including an electrostatic discharge protection circuit for providing cross-domain ESD protection.
Figure 2:
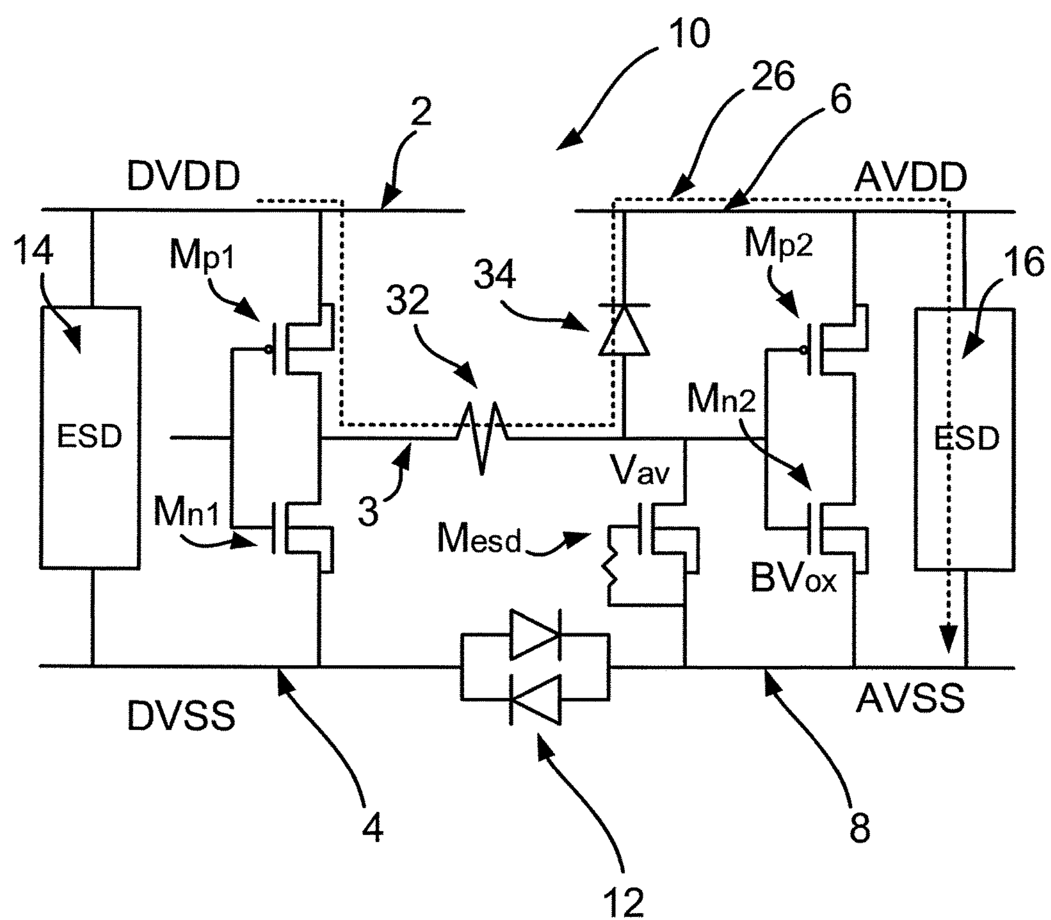
FIG. 2 shows another semiconductor device including an electrostatic discharge protection circuit for providing cross-domain ESD protection.
Figure 3:
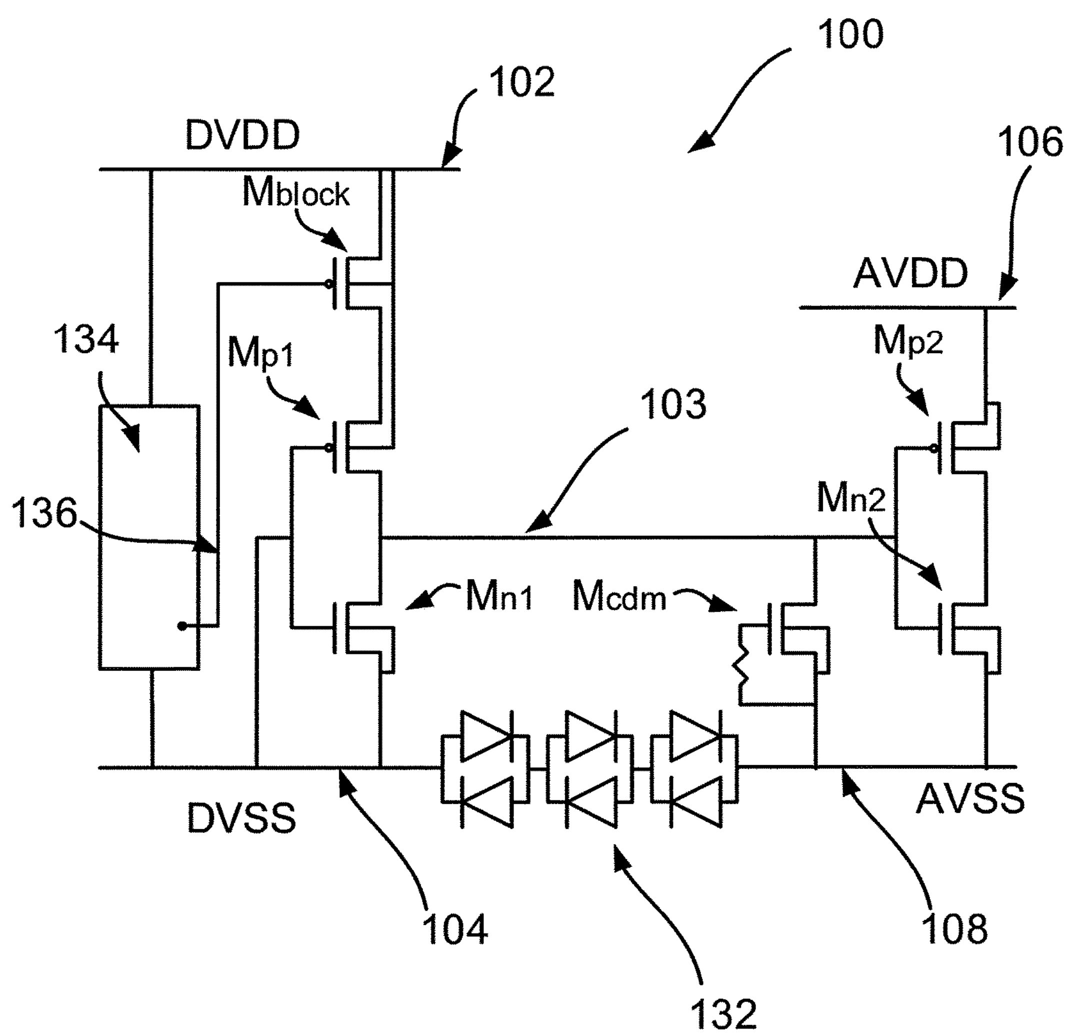
FIG. 3 shows a semiconductor device including an electrostatic discharge protection circuit for providing cross-domain ESD protection in accordance with an embodiment of the invention.

FIG. 3 illustrates a semiconductor device 100 according to a first embodiment of this invention. The device 100 includes a digital domain shown generally on the left-hand side of FIG. 3 and an analogue domain shown generally on the right-hand side of FIG. 3. The digital domain includes a digital domain power rail 102 and a digital domain ground rail 104. The digital domain power rail 102 is also labelled DVDD in FIG. 3, while the digital domain ground rail 104 is also labelled DVSS. The analogue domain includes an analogue domain power rail 106 (which is also labelled AVDD in FIG. 3) and an analogue domain ground rail 108 (which is also labelled AVSS in FIG. 3). For the purposes of this invention, the term "ground rail" is not taken to mean necessarily a rail that is connected to ground. Instead, it is envisaged that the ground rail (such as the digital domain ground rail 104 and the analogue domain ground rail 108) are simply rails that are connected to potentials lower than their corresponding power rails.

The device 100 has a signal line 103 that connects the digital domain to the analogue domain to allow signals to pass between them. In this embodiment, the digital domain is provided with a CMOS inverter that has a PMOS transistor Mp1 and an NMOS transistor Mn1 connected to the signal line 103 for transmitting signals to the analogue domain. Similarly, the analogue domain has a CMOS inverter having PMOS transistor Mp2 and an NMOS transistor Mn2 connected together to receive, at a gate node thereof, signals from the digital domain along the signal line 103. The CMOS inverter of the analogue domain is connected between the analogue domain power rail 106 and the analogue domain ground rail 108. Similarly, the CMOS inverter of the digital domain is connected in between the digital domain power rail 102 and the digital domain ground rail 104. As will be described in more detail below, a further transistor Mblock is located in between the transistor Mp1 of the CMOS inverter of the digital domain and the digital domain power rail 102.

The semiconductor device 100 further includes a power rail clamp 134 connected between the digital domain power rail 102 and the digital domain ground rail 104 for discharging an ESD current from the digital domain power rail 102 to the digital domain ground rail 104. As will be described in more detail below, the power rail clamp 134 is also operable to apply a control signal to a gate of the transistor Mblock to turn this blocking transistor off during an ESD event to prevent an ESD current discharging through the signal line 103. During such an event, the ESD current is instead discharged through the power rail clamp 134 to the digital domain ground rail 104. The semiconductor device in this embodiment may also be provided with one or more pairs of back-to-back diodes 132 for allowing an ESD current to discharge from the digital domain ground rail 104 to the analogue domain ground rail 108 or vice versa. In FIG. 3, three pairs of back-to-back diodes 132 are illustrated, but it is envisaged that a different number (for example, fewer than three pairs) of back-to-back diodes may be provided.

The semiconductor device 100 in this example may also be provided with a local charge device model (CDM) clamp Mcdm. Mcdm may be connected between the signal line 103 and the analogue domain ground rail 108. This local CDM clamp may act to provide a discharge path for an ESD current in the event of ESD zapping from the analogue domain ground rail 108 to the digital domain power rail 102.

Note that FIG. 3 shows that the semiconductor device 100 does not include an interface resistor on the signal line 103. The semiconductor device shown in FIG. 3 further does not include a diode connected between the signal line 103 and the analogue domain power rail 106. Accordingly, and as noted above, embodiments of this invention can provide ESD protection without deleterious effects associated with the provision of an interface transistor (namely the impairment of high frequency operation of the device) and/or a diode connecting the signal line 103 and the analogue domain power rail 106 (namely the increased leakage current from the digital domain power rail 102 to the analogue domain power rail 106).

During normal operation of the device, the blocking transistor Mblock is switched on to allow current to pass between the digital domain power rail 102 and the CMOS inverter of the digital domain. Accordingly, during normal operation, a current is allowed to flow from the digital domain power rail 102 through the signal line 103 according to the switching state of the CMOS inverter of the digital domain. This can allow, for instance, signals to be transmitted by the digital domain along the signal line 103 to reach the CMOS inverter of the analogue domain acting as a receiver.

During an ESD event, such as ESD zapping from the digital domain power rail 102 to the analogue domain ground rail 108, the blocking transistor Mblock in this example is switched off to block an ESD current from discharging from the digital domain power rail 102 to the CMOS inverter of the digital domain and through the signal line 103. Accordingly, the ESD current may not reach delicate internal circuitry of the device 100. For instance, the ESD current may not reach the CMOS inverter of the analogue domain and in particular may not reach the gate of the NMOS transistor Mn2 of the CMOS inverter of the analogue domain. Accordingly, the above-mentioned problem relating to the thin gate oxide provided in such transistors in advance technology nodes is avoided, and it is not necessary to consider the voltage Vav of a local CDM clamp such as Mcdm as shown in FIG. 3 in relation to the breakdown voltage of the gate oxide of Mn2.

Instead of flowing through the blocking transistor, the CMOS inverter of the digital domain and the signal line 103, the ESD current in such an ESD event is discharged through the power rail clamp 134.

Where the ESD event is associated with ESD zapping from the digital domain power rail 102 to the analogue domain ground rail 108, the ESD current that is discharged through the power rail clamp 134 to the digital domain ground rail 104 can pass through the plurality of back-to-back diodes 132 to reach the analogue domain ground rail 108, again bypassing the delicate internal circuitry of the semiconductor device 100.

In the example of FIG. 3, the gate node of the CMOS inverter of the digital domain is connected to the digital domain ground rail 104. This represents, for illustrative purposes only, the "worst case scenario" an ESD event, in which, in the absence of the operation of the blocking transistor, the ESD current would discharge through the transistor Mp1 of the CMOS inverter which would be fully switched on and through the signal line 103 to damage delicate circuitry of the analogue domain such as the gate oxide of the transistor Mn2.

In this example, the operation of the blocking transistor Mblock to switch on during normal operation and to switch off during an ESD event is implemented by a control signal that is applied to a gate of the blocking transistor Mblock by the power rail clamp 134.

The power rail clamp 134 may in some embodiments have an output connected via a control line 136 to a gate oxide of the blocking transistor Mblock for applying the control signal thereto.

Figure 4:
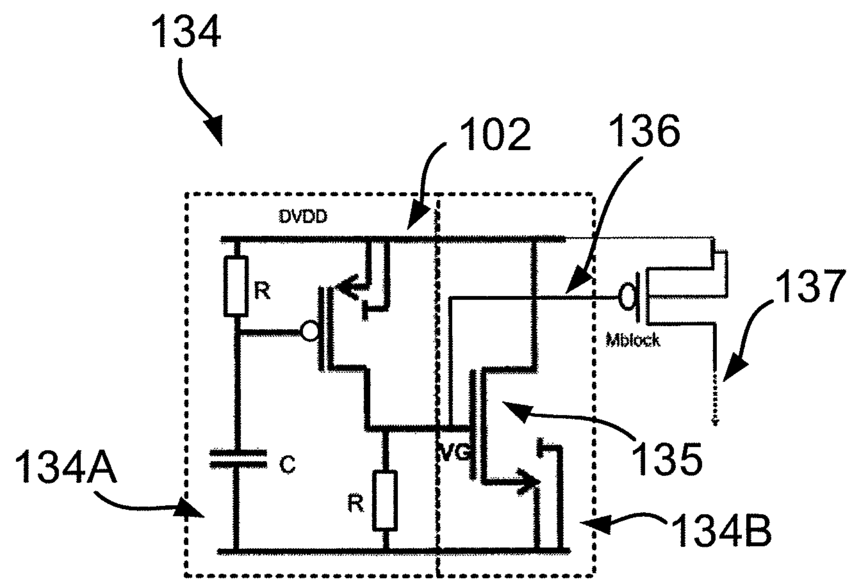
FIG. 4 shows an embodiment of a power rail clamp of an electrostatic discharge protection circuit of a semiconductor device in accordance with an embodiment of the invention.
Figure 5:
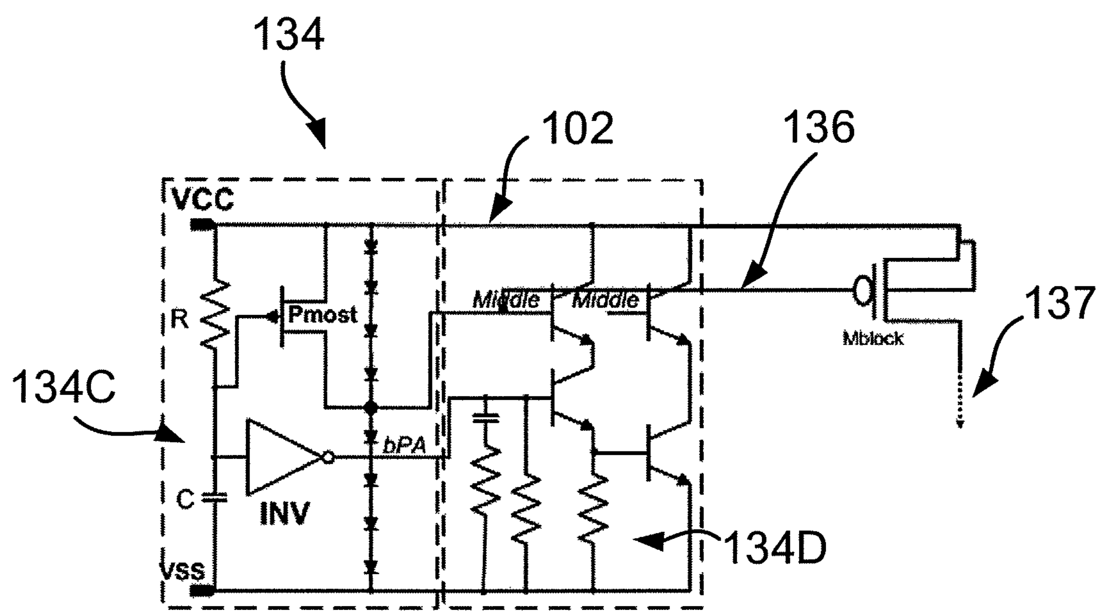
FIG. 5 shows an embodiment of a power rail clamp of an electrostatic discharge protection circuit of a semiconductor device in accordance with another embodiment of the invention.

The power rail clamp 134 can take a number of different forms. It is envisaged that the power rail clamp may be an RC-triggered power rail clamp with slew rate detection circuitry which can be reused to control the blocking transistor Mblock. Two examples of power rail clamps that may be used in accordance with embodiments of this invention are shown in FIGS. 4 and 5 and described below. In both FIGS. 4 and 5 the dotted arrow labelled 137 leads to the CMOS inverter of the digital domain of the device 100 (see also FIG. 3).

FIG. 4 shows a first example of a power rail clamp 134 in accordance with an embodiment of this invention. The power rail clamp 134 includes a trigger stage 134A and a discharge stage 134B. The trigger stage 134A includes an RC circuit for detecting an ESD event. The discharge stage 134B includes a transistor 135 for discharging the ESD current through the power rail clamp 134 from the digital domain power rail 102 to the digital domain ground rail 104. The transistor 135 of the discharge stage in this example is controlled by an output of the trigger stage 134A, which is connected to a gate of the transistor 135. During normal operation (i.e. when there is no ESD event) the gate voltage (indicated as "VG" in FIG. 4) of the discharge transistor 135 is at a low potential state. During an ESD event, the trigger stage 134A output is at a high potential state to switch on the transistor 135 for conducting the ESD current.

In accordance with an embodiment of this invention, the control signal applied by the power rail clamp 134 to the blocking transistor Mblock can correspond to the control signal applied to the discharge stage 134B by the trigger stage 134A. For instance, as shown in FIG. 4, the gate node of the transistor 135 may be connected via the control line 136 to the gate of the blocking transistor Mblock. Thus, during normal operation, while VG is at a low potential state, the blocking transistor is switched on, but during an ESD event, in which the gate voltage VG of transistor 135 is at a high state, the blocking transistor Mblock is switched off. After the ESD event has passed, the signal applied by the trigger stage 134 to the gate of the transistor 135 of the discharge stage 134B returns to its low potential state, and therefore the blocking transistor is again switched on for normal operation.

A second example of a power rail clamp 134 that may be used in a semiconductor device 100 in accordance with an embodiment of this invention is shown in FIG. 5. The example shown in FIG. 5 also includes a trigger stage 134C and a discharge stage 134D. In this example, the power supply clamp 134 is an active Darlington bipolar, also known as the "crowbar". In this example, during normal operation, the gate voltages of transistors in the discharge stage 134D indicated "Middle" are at a low potential state, while during an ESD event the gate voltages of these transistors are at a high potential state to switch them on to allow the ESD current to be discharged from the digital domain power rail 102 to the digital domain ground rail 104. In common with the example of FIG. 4, the control voltage applied to these transistors by a control signal from the trigger stage 134A may also be connected to the gate of the blocking transistor Mblock by the control line 136. Thus, during normal operation, when "Middle" is at a low potential state, the blocking transistor Mblock is switched on for normal operation of the CMOS inverter. On the other hand, during an ESD event, when the voltage "Middle" is at a high potential state, the blocking transistor Mblock is switched off by the control signal applied through the control line 136, to block the ESD current from passing through the blocking transistor Mblock to the CMOS inverter of the digital domain.

In accordance with embodiments of this invention, because the circuitry that provides the ESD protection for zapping from the digital domain power rail 102 to the analogue domain ground rail 108 is provided largely within the digital domain, the area impact at the receiver side of including such features in a semiconductor device is minimised. Moreover, because no separate circuitry needs to be provided for controlling the blocking transistor Mblock (i.e. a control signal used within the power rail clamp may be reused to also control Mblock), the area impact at the transmitter side may also be minimised.

FIGS. 6-9 show the results of tests that have been performed using a circuit of the kind shown in FIG. 3 to demonstrate the ability of embodiments of this invention to provide ESD protection for a semiconductor device having a digital domain and an analogue domain. The particular device used to obtain these results included three back-to-back transistors 132 as shown in FIG. 3, with the gate node of the CMOS inverter of the digital domain connected to the digital domain ground rail.

FIGS. 6A and 6B show transmission line pulse (TLP) data comparing the operation of a standalone charged model device transistor (such as Mcdm in FIG. 3) with the overall circuit as shown in FIG. 3. The data relating to the standalone local CDM clamp transistor (Mcdm) are indicated by the plots 140 and 150 in FIGS. 6A and 6B respectively. The data corresponding to an embodiment of this invention are represented by the lines 142 and 152 in FIGS. 6A and 6B, respectively.

For the standalone Mcdm transistor corresponds to data under and ESD event from the drain to the ground side of the device. As can be seen in FIGS. **6*a* and 6B, the device fails at a current of around 0.25 amps. In comparison, the line 142 in FIG. 6**A shows device failure at around 2.1 Amps. Note that ESD performance is generally proportional to this device failure current.

In FIG. 6B, the leakage current is shown by the line 152 as being slightly higher for the embodiment of this invention than for the standalone Mcdm local clamp transistor (compare lines 152 with 150, respectively). This is because line 152 represents the whole of the circuit of FIG. 3, while line 150 corresponds to a single standalone transistor (Mcdm).

Accordingly, both FIGS. 6A and 6B illustrate that the blocking transistor in the test device is effective in blocking current from passing through the signal line 103, since otherwise the line shape (particularly, the device failure current) of the lines 142 and 152 would be similar or identical to that of the standalone Mcdm local CDM clamp transistor (lines 140 and 150).

The above described tests were also performed using vf-TLP pulses to produce vf-TLP test data, which is presented in FIGS. 7A and 7B. The vf-TLP pulse had a pulse width of 1 ns and a rise time of 100 ps. The results in FIGS. 7A and 7B are broadly similar to those described above in relation to FIGS. 6A and 6B. In particular, it can be seen that the TLP line shape produced by an embodiment of this invention (see data 162 and 172) differ substantially from the line shapes produced by a standalone local CDM clamp transistor Mcdm (see the plots 160 and 170). In FIG. 7A, and also in FIG. 7B, the device failure current of the embodiment of this invention is shown to be substantially higher (around 4.2 amps) than the standalone Mcdm transistor (around 2.1 amps) under vf-TLP conditions. In FIG. 7B, again the leakage current associated with an embodiment of this invention is slightly higher than that of a standalone local CDM clamp transistor Mcdm. Again, this is because line 152 represents the whole of the circuit of FIG. 3, while line 150 corresponds to a single standalone transistor (Mcdm).

For the data shown in FIGS. 7A and 7B, FIG. 8 shows a voltage wave form plot (again, the data was produced under vf-TLP). Line 180 in FIG. 8 corresponds to the standalone CDM clamp transistor while the line 182 corresponds to an embodiment of this invention. As noted above, if the blocking transistor described above in relation to FIG. 3 were not operating correctly to block current passing through the signal line during an ESD event, it might be expected that the line shape (particularly the device failure current) of the lines 180 and 182 in FIG. 8 would be similar. However, it is clear in FIG. 8 that the peak voltage for the line 182 is rather lower than that associated with the standalone local clamp transistor Mcdm (the line 180). Accordingly, FIG. 8 also demonstrates that the blocking transistor is operating correctly to prevent current reaching the signal line 103 and delicate circuitry such as the transistor Mn2.

FIGS. 9A and 9B show vf-TLP measurements as a function of the effective resistance of the analogue domain ground rail 108 of an embodiment of the kind described above in relation to FIG. 3. In particular, these data were repeated for four different values of resistance of the analogue domain ground rail 108 between the source of the transistor Mcdm and the source of the transistor Mn2. Plots 190 and 200 correspond to a resistance of 1Ω. Plots 192 and 202 correspond to a resistance of 10Ω, plots 194 and 204 correspond to a resistance of 100Ω and plots 196 and 206 correspond to a resistance of 1KΩ.

As can be seen in FIGS. 9A and 9B, the ESD robustness of the device for values of resistance of the analogue domain ground rail 108 between the sources of Mcdm and Mn2 is much better for resistances of no greater than 10Ω. As can be seen from the plots 194, 196, 204 and 206, where the resistance is greater than 10≠, the device failure current is much lower. This because for resistance values greater than 10 Ohm, the clamping voltage across the gate oxide (Vgs) is higher than the gate oxide breakdown voltage.

The resistance of the analogue domain ground rail 8 can be varied in a number of ways. For example, the choice of material and/or the length of the connection between the sources of the two transistors Mcdm and Mn2 can be set in accordance with the desired resistance. In one embodiment, an undulating connection can be used to increase the overall length of the ground rail between the sources of the two transistors in order to increase the effective resistance thereof.

A semiconductor device in accordance with the embodiment of this invention can be used in an RF circuit. For instance, the RF circuit may comprise a mixed signal device for digitally processing data and then transmitting it to an analogue domain (or vice versa). Examples of devices that may include an embodiment of this invention include high speed interfaces or any other device that includes multiple power domains and/or requires cross-domain ESD protection.

Accordingly, there has been described a semiconductor device and method. The device includes a first domain and a second domain each having a power rail and a ground rail. The device further includes a signal line connected between the first domain and the second domain. The device also includes an electrostatic discharge protection circuit for providing cross-domain ESD protection. The protection circuit includes a blocking transistor connected between the first domain power rail and the signal line. The protection circuit also includes a power rail clamp connected between the first domain power rail and the first domain ground rail. The power rail clamp is operable to apply a control signal to a gate of the blocking transistor to switch it on during normal operation and to switch it off during an ESD event. The power rail clamp is operable during the ESD event to conduct an ESD current.

Although particular embodiments of the invention have been described, it will be appreciated that many modifications/additions and/or substitutions may be made within the scope of the claimed invention.

The invention claimed is:

1. A semiconductor device comprising:

a first domain including a first domain power rail and a first domain ground rail;

a second domain including a second domain power rail and a second domain ground rail;

a signal line connected between the first domain and the second domain, and an electrostatic discharge (ESD) protection circuit for providing cross-domain ESD protection, the ESD protection circuit comprising:

a blocking transistor connected between the first domain power rail and the signal line, and a power rail clamp connected between the first domain power rail and the first domain ground rail, wherein the power rail clamp is operable: during normal operation of the device to apply a control signal to a gate of the blocking transistor to allow current to flow from the first domain power rail through the signal line, and during an ESD event to: conduct an ESD current between the first domain power rail and the first domain ground rail, and apply a control signal to the gate of the blocking transistor to block an ESD current from flowing from the first domain power rail through the signal line.

2. The semiconductor device of claim 1, wherein the power rail clamp is an RC-triggered power rail clamp.

3. The semiconductor device of claim 2, wherein the RC-triggered power rail clamp comprises: a discharge stage for conducting the ESD current between the first domain power rail and the first domain ground rail, and a trigger stage comprising an RC circuit for detecting the ESD event and activating the discharge stage to conduct the ESD current, wherein the blocking transistor is operable to block an ESD current from flowing from the first domain power rail through the signal line while the discharge stage of the RC-triggered power rail clamp is active.

4. The semiconductor device of claim 3, wherein the control signal applied to the gate of the blocking transistor corresponds to a control signal applied to the discharge stage by the trigger stage to activate the discharge stage.

5. The semiconductor device of claim 3, wherein the control signal applied to the gate of the blocking transistor comprises a control voltage.

6. The semiconductor device of claim 1, wherein the first domain ground rail is connected to the second domain ground rail whereby, during the ESD event, the ESD current can flow from the first domain ground rail to the second domain ground rail.

7. The semiconductor device of claim 6, wherein the first domain ground rail and the second domain ground rail are connected together via a plurality of diodes arranged in a back-to-back configuration.

8. The semiconductor device of claim 1, wherein: the first domain further comprises an output stage comprising a CMOS inverter connected to the signal line, and the second domain further comprises an input stage comprising a CMOS inverter connected to the signal line.

9. The semiconductor device of claim 8, wherein said blocking of an ESD current from flowing from the first domain power rail through the signal line protects a gate dielectric of an NMOS transistor of the CMOS inverter of the input stage against ESD damage.

10. The semiconductor device of claim 1 further comprising a local charged device model clamp comprising a transistor connecting the second domain ground rail to the signal line, for providing a path for an ESD current to flow from the second domain ground rail to the first domain power rail.

11. The semiconductor device of claim 9, further comprising a local charged device model clamp comprising a transistor connecting the second domain ground rail to the signal line, for providing a path for an ESD current to flow from the second domain ground rail to the first domain power rail; and wherein a resistance of a part of the second domain ground rail between a source of the transistor of the local charged device model clamp and a source of the NMOS transistor of the CMOS inverter of the input stage is no greater than 10□.

12. The semiconductor device of claim 1, wherein the signal line does not include an interface resistor.

13. The semiconductor device of claim 1, wherein the device is a mixed signal device in which one of said first and second domains is a digital domain and the other of said first and second domains is an analogue domain.

14. A radio frequency circuit comprising the semiconductor device of claim 1.

15. A method for providing cross-domain electrostatic discharge (ESD) protection in a semiconductor device having a first domain including a first domain power rail and a first domain ground rail, a second domain including a second domain power rail and a second domain ground rail, and a signal line connected between the first domain and the second domain, the method comprising: during normal operation of the device, a power rail clamp connected between the first domain power rail and the first domain ground rail applying a control signal to a gate of a blocking transistor connected between the first domain power rail and the signal line to allow current to flow from the first domain power rail through the signal line, and during an ESD event, the power rail clamp: conducting an ESD current between the first domain power rail and the first domain ground rail, and applying a control signal to the gate of the blocking transistor to block an ESD current from flowing from the first domain power rail through the signal line.

* * * * *